(12) United States Patent
Ikeda et al.

(10) Patent No.: US 10,367,359 B2
(45) Date of Patent: Jul. 30, 2019

(54) POWER CONTROL APPARATUS AND POWER CONTROL SYSTEM

(71) Applicant: Kabushiki Kaisha Toshiba, Minato-ku (JP)

(72) Inventors: Sonoka Ikeda, Kanagawa (JP); Shinichiro Kosugi, Kanagawa (JP); Masahiro Sekino, Tokyo (JP); Osamu Yamazaki, Tokyo (JP); Kazuto Kuroda, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 173 days.

(21) Appl. No.: 15/455,772

(22) Filed: Mar. 10, 2017

(65) Prior Publication Data

US 2017/0187203 A1 Jun. 29, 2017

Related U.S. Application Data

(63) Continuation of application No. PCT/JP2015/083235, filed on Nov. 26, 2015.

(51) Int. Cl.
*H02J 7/00* (2006.01)
*G01R 31/389* (2019.01)
(Continued)

(52) U.S. Cl.
CPC .......... *H02J 7/0021* (2013.01); *G01R 31/389* (2019.01); *H01M 10/425* (2013.01);
(Continued)

(58) Field of Classification Search
CPC .... H02J 7/0021; H01M 10/482; H01M 10/44; H01M 10/446; H01M 10/425;
(Continued)

(56) References Cited

U.S. PATENT DOCUMENTS

| 2003/0052646 A1* | 3/2003 | Minamiura | B60L 3/0023 320/122 |
| 2007/0145954 A1* | 6/2007 | Kawahara | B60L 11/1864 320/150 |
| 2014/0197686 A1* | 7/2014 | Hiramura | H02J 7/0013 307/29 |

FOREIGN PATENT DOCUMENTS

| JP | 2007-165211 A | 6/2007 |
| JP | 2008-276950 A | 11/2008 |

(Continued)

OTHER PUBLICATIONS

Battery management system, available at https://web.archive.org/web/20151023184443/https://en.wikipedia.org/wiki/Battery_management_system on Oct. 23, 2015.*

(Continued)

*Primary Examiner* — Daniel R Miller
(74) *Attorney, Agent, or Firm* — Oblon, McClelland, Maier & Neustadt, L.L.P.

(57) ABSTRACT

A power control apparatus according to an embodiment includes an acquisition unit and a determination unit. The acquisition unit acquires information relating to a voltage and an electric current of a chargeable/dischargeable secondary battery during charging/discharging. The determination unit determines a maximum current of the secondary battery during charging on the basis of the information acquired by the acquisition unit so that the voltage of the secondary battery does not exceed a predetermined voltage.

14 Claims, 10 Drawing Sheets

(51) Int. Cl.
*H01M 10/42* (2006.01)
*H01M 10/44* (2006.01)
*H01M 10/48* (2006.01)

(52) U.S. Cl.
CPC ......... *H01M 10/44* (2013.01); *H01M 10/446* (2013.01); *H01M 10/48* (2013.01); *H01M 10/482* (2013.01); *H01M 2010/4271* (2013.01); *H01M 2220/20* (2013.01)

(58) Field of Classification Search
CPC ............ H01M 10/48; H01M 2220/20; H01M 2010/4271; G01R 31/3662
See application file for complete search history.

(56) References Cited

FOREIGN PATENT DOCUMENTS

| | | |
|---|---|---|
| JP | 2011-103748 | 5/2011 |
| JP | 2011-177011 A | 9/2011 |
| JP | 2014-77681 | 5/2014 |
| JP | 2005-177601 A | 10/2015 |

OTHER PUBLICATIONS

Office Action dated Aug. 8, 2017 in Japanese Patent Application No. 2017-511805 with English translation, 7 pages.

* cited by examiner

| TEMP / SOC | ~-30°C | -30°C~-20°C | -20°C~-10°C | -10°C~0°C | 0°C~10°C | 10°C~25°C | 25°C~35°C | 35°C~45°C | 45°C~55°C | 55°C~65°C | 65°C~ |
|---|---|---|---|---|---|---|---|---|---|---|---|
| 80%~100% | 62A | 62A | 62A | 62A | 62A | 62A | 62A | 62A | 62A | 62A | 62A |
| 60%~80% | 62A | 62A | 62A | 62A | 62A | 62A | 62A | 62A | 62A | 62A | 62A |
| 40%~60% | 62A | 62A | 62A | 62A | 62A | 62A | 62A | 62A | 62A | 62A | 62A |
| 20%~40% | 62A | 62A | 62A | 62A | 62A | 62A | 62A | 62A | 62A | 62A | 62A |
| 0%~20% | 62A | 62A | 62A | 62A | 62A | 62A | 62A | 62A | 62A | 62A | 62A |

POWER CONTROL APPARATUS AND POWER CONTROL SYSTEM

CROSS-REFERENCE TO RELATED APPLICATION

This application is a continuation application of International Application No. PCT/JP2015/083235, filed Nov. 26, 2015, which designates the United States and is incorporated herein by reference.

FIELD

Embodiments of the present invention relate to a power control apparatus and a power control system.

BACKGROUND

In recent years, the application of secondary batteries to hybrid applications with engines of locomotives, buses, construction machines, or the like or to power fluctuation suppression applications in stationary type industrial equipment has become active. In these applications, input and output of a large electric current, and a charging state range where energy can be used in a wide range are required. Conventionally, in order to use an energy capacity capable of being used for storage or traveling without waste, a technique for controlling an upper or lower limit of a charging state range where energy of a secondary battery can be used by specifying the limits using an electric capacity has been widely used. However, in situations where the charging state range is specified using the electric capacity to be set in a wide range, before reaching the upper or lower limit electric capacity, an upper or lower limit value of a closed-circuit voltage of the battery may arrive, so that the equipment may stop. That is, a usable energy range may be greatly limited. In this way, there may be situations where a voltage of a secondary battery cannot be accurately limited.

In order to solve the above-mentioned problem, an object of the invention is to provide a power control apparatus and a power control system capable of accurately limiting a voltage of a secondary battery.

Solution to Problem

According to an embodiment, there is provided a power control apparatus including an acquisition unit and a determination unit. The acquisition unit acquires information relating to a voltage and an electric current of a chargeable/dischargeable secondary battery during charging. The determination unit determines a maximum current of the secondary battery during charging on the basis of the information acquired by the acquisition unit so that the voltage of the secondary battery does not exceed a first predetermined voltage.

BRIEF DESCRIPTION OF THE DRAWINGS

FIG. 4 is a diagram showing an example of voltage/current profile information 62.

DETAILED DESCRIPTION

The power control apparatus and power control system includes a power control apparatus comprising acquisition circuitry configured to acquire information relating to a voltage and an electric current of a secondary battery during charging/discharging; estimation circuitry configured to estimate a voltage of the secondary battery at a zero current based on the information acquired by the acquisition circuitry; and current determining circuitry configured to determine a maximum current of the secondary battery during charging using the voltage of the secondary battery at the zero current estimated by the estimation circuitry and a predetermined voltage.

Hereinafter, a power control apparatus and a power control system according to embodiments will be described with reference to the accompanying drawings.

Figure 1:
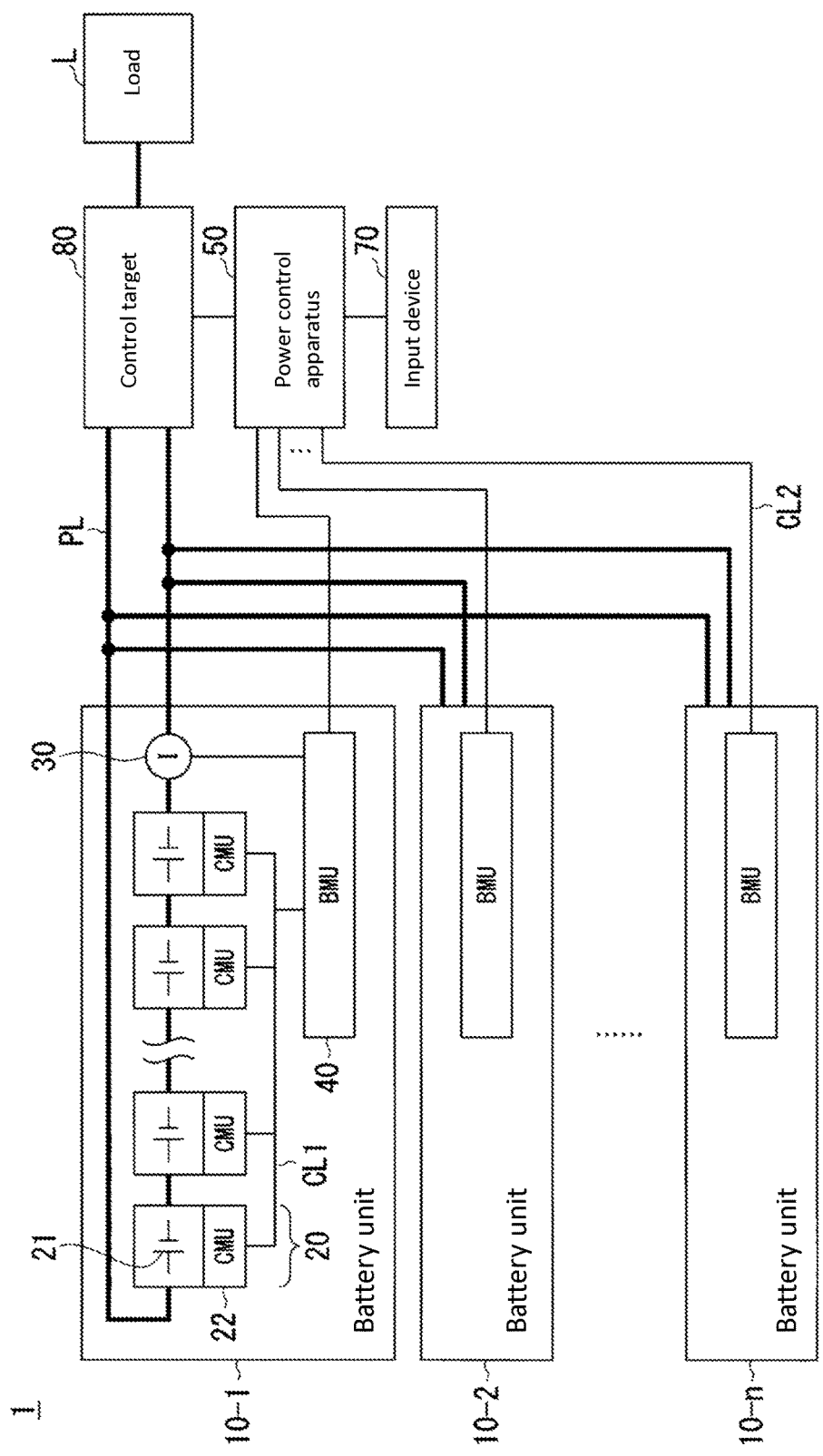
FIG. 1 is a diagram showing an exemplary configuration of a power control system 1.

FIG. 1 is a diagram showing an exemplary configuration of a power control system 1. The power control system 1 may include battery units 10-1, 10-2, ..., and 10-n (n is an arbitrary natural number), a power control apparatus 50, an input device 70, and a control target 80, but is not limited thereto. Hereinafter, when the battery units are not distinguished from each other, the battery units are simply denoted as the battery units 10.

The plurality of battery units 10 are connected to the control target 80 in parallel through power lines PL to supply power to the control target 80. Since the respective battery units 10 have the same configuration (which may be partially different from each other), in the figure, only a configuration of the battery unit 10-1 is shown in detail as a representative of the plurality of battery units. The battery unit 10 includes a plurality of battery modules 20 which are connected to each other in series, a current sensor 30, and a battery management unit (BMU) 40. The respective components in the battery unit 10 are connected to each other through an in-unit communication line CL1. In the in-unit communication line CL1, for example, communication based on a controller area network (CAN) is performed.

Figure 2:
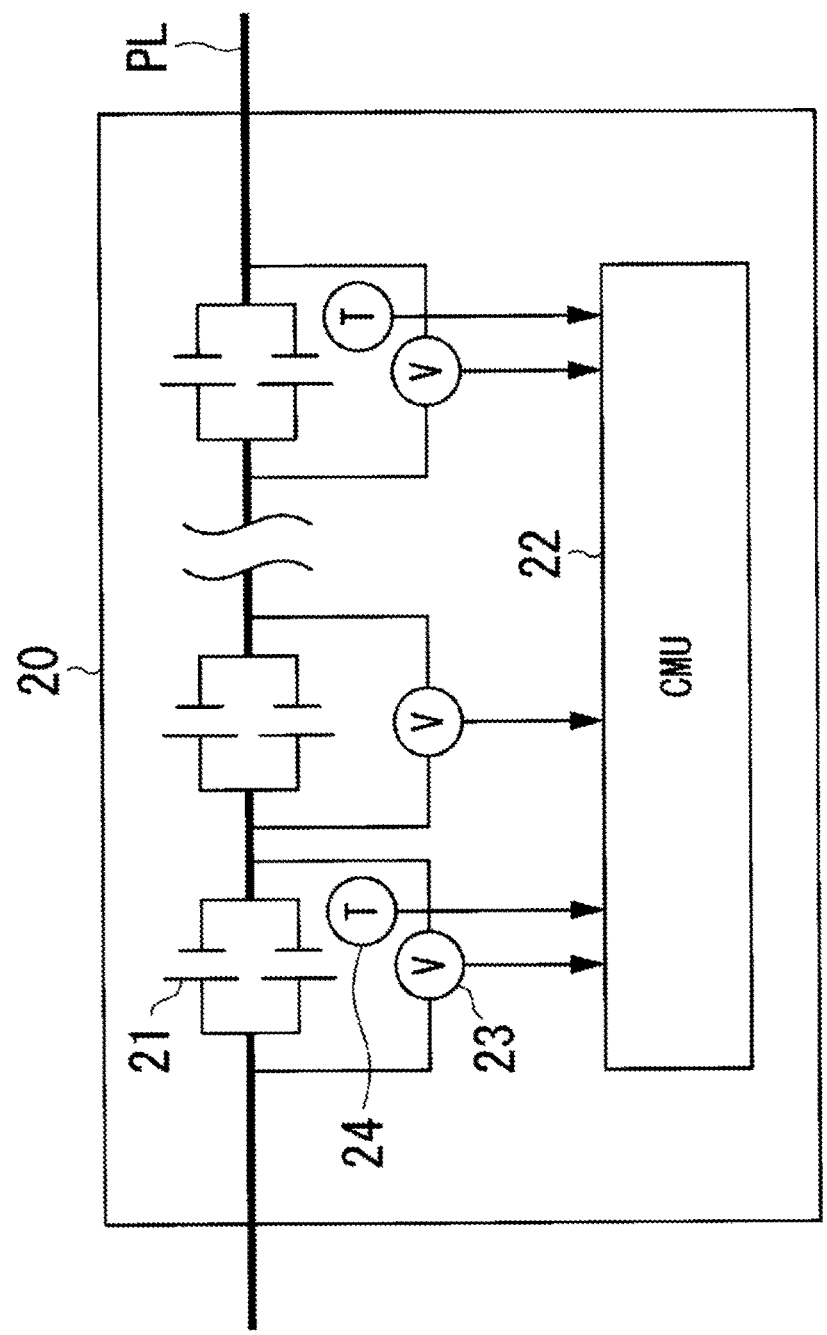
FIG. 2 is a diagram showing an exemplary configuration of a battery module 20.

FIG. 2 is a diagram showing an exemplary configuration of the battery module 20. The battery module 20 is an assembled battery (battery) in which a plurality of battery cells 21 are connected to each other. Further, each battery unit 10 and a result of the parallel connection of the battery units 10 also similarly form assembled batteries (batteries). In the battery module 20, for example, sets of two battery cells 21 which are connected to each other in parallel are connected to each other in series. This configuration is not limiting, and a connection form of the battery cells in the battery module 20 may be arbitrarily determined.

The battery cell 21 is a chargeable/dischargeable secondary battery such as a lithium ion battery, a lead storage battery, a sodium sulfur battery, a redox flow battery, or a nickel metal hydride battery. In the case of the lithium ion battery, the battery cell 21 may use lithium titanate as an anode material. In FIGS. 1 and 2, a configuration for charging the battery cell 21 is not shown.

The battery module 20 further includes a cell monitoring unit (CMU) 22, a plurality of voltage sensors 23, and a plurality of temperature sensors 24. The CMU 22 includes a processor such as a central processing unit (CPU), a variety of storage devices, a CAN controller, a communication interface, and the like.

Each voltage sensor 23 measures a voltage of the set of the battery cells 21 which are connected to each other in parallel, for example. In addition, the temperature sensors 24 are attached to arbitrary places in the battery module 20, and the number thereof is arbitrary. Detection results of the voltage sensors 23 and the temperature sensors 24 are output to the CMU 22. The CMU 22 outputs the detection results of the voltage sensors 23 and the temperature sensors 24 to the BMU 40.

Returning to FIG. 1, the BMU 40 is connected to the plurality of CMUs 22 through the in-unit communication line CL1, and is connected to the power control apparatus 50 through a communication line CL2. The BMU 40 includes a processor such as a CPU, a variety of storage devices, a CAN controller, a communication interface corresponding to the communication line CL2, and the like. Wireless communication may be performed between the BMU 40 and the power control apparatus 50 without using the communication line CL2. A detection result of the current sensor 30 that detects an electric current that flows in the battery module 20 of the battery unit 10 is input to the BMU 40.

The power control apparatus 50 includes a processor such as a CPU, a variety of storage devices, a communication interface corresponding to the communication line CL2, and the like. The power control apparatus 50 controls the control target 80 on the basis of information input from the plurality of BMUs 40 and operation information input from the input device 70.

Figure 3:
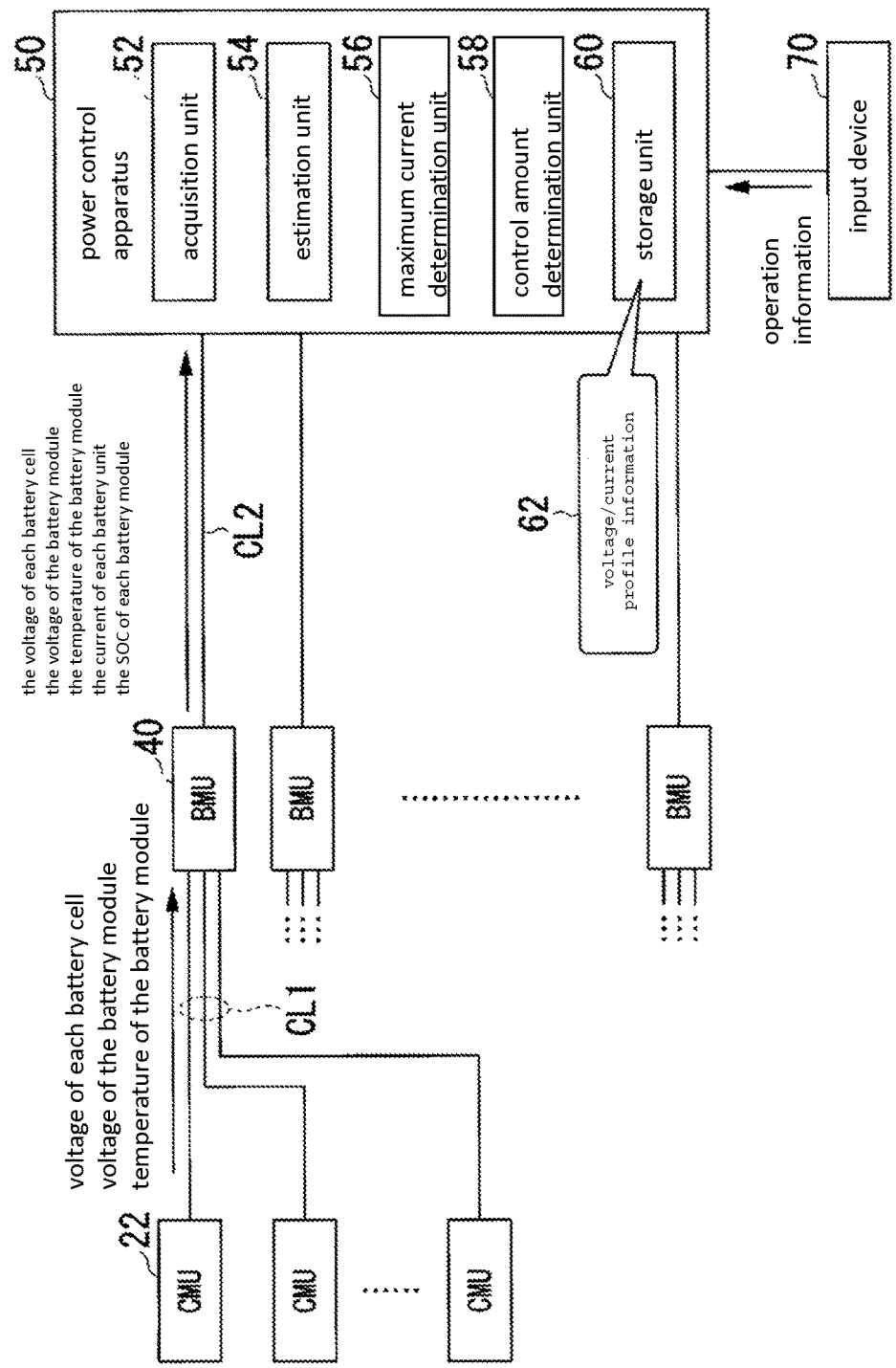
FIG. 3 is a diagram showing an exemplary configuration relating to control in the power control system 1.

FIG. 3 is a diagram showing an exemplary configuration relating to control in the power control system 1. Information on a voltage of each battery cell 21, a voltage of the battery module 20, a temperature of the battery module 20, and the like is provided to the BMU 40 from the CMU 22. The CMU 22 adds up the voltages of the respective battery cells 21 to calculate the voltage of the battery module 20. Instead, the BMU 40 may add up the voltages of the respective battery cells 21 to calculate the voltage of the battery module 20.

The BMU 40 calculates a state of charge (SOC) of each battery module 20 on the basis of a detection result of the current sensor 30 (see FIG. 1). The SOC of each battery module 20 (or an SOC of each battery cell 21) may be calculated by the CMU 22 on the basis of a detection result of the voltage sensor 23, for example. The BMU 40 outputs the information on the voltage of each battery cell 21, the voltage of the battery module 20, the temperature of the battery module 20 and the like, input from the CMU 22, and the calculated SOC to the power control apparatus 50.

The power control apparatus 50 includes a processor such as a CPU, a variety of storage devices, the communication lines CL2, a communication interface corresponding to communication with the control target 80, and the like. The power control apparatus 50 includes an acquisition unit 52, an estimation unit 54, a maximum current determination unit 56, a control amount determination unit 58, and a storage unit 60, as functional components. A part or all of the estimation unit 54, the maximum current determination unit 56, and the control amount determination unit 58 are realized by executing a program stored in the storage unit 60 by a processor such as a CPU. Further, these functional units may be realized by hardware such as a large scale integration (LSI), an application specific integrated circuit (ASIC), or a field-programmable gate array (FPGA).

The acquisition unit 52 includes a communication interface, and stores information acquired from the BMU 40 in the storage unit 60.

The estimation unit 54 acquires information relating to a voltage and an electric current of a secondary battery (the battery cell 21, the battery module 20, or the battery unit 10) during charging and discharging, and estimates an internal resistance of the secondary battery and a voltage at a zero current on the basis of the acquired information.

The maximum current determination unit 56 determines a maximum current of the secondary battery during charging or discharging on the basis of comparison of the result estimated by the estimation unit 54 and an upper limit voltage $Vc_{MAX}$ or a lower limit voltage $Vc_{MIN}$.

The control amount determination unit 58 determines a control amount to be given to the control target 80 on the basis of operation information input from the input device 70 and the maximum current determined by the maximum current determination unit 56. The input device 70 may include a lever switch, a dial switch, a variety of keys, a touch panel, or the like.

The control target 80 includes a plurality of transistors, and may include a DC-AC converter that converts a direct current to an alternating current by switching control of the transistors. In this case, the control amount to be given to the control target 80 refers to a duty ratio in switching control, for example. In addition, in a case where the control target 80 is a device for supplying power to a cage type induction motor, the control amount to be given to the control target 80 may include a command value such as an i-axis current or a q-axis current. Further, the control target 80 may include a power generator that generates power and supplies the power to the battery unit 10, a device that discards a part of power to be supplied to the power generator as heat (a device that limits electric power generation), or the like.

The function of the control amount determination unit 58 may be a function of a separate control apparatus from the power control apparatus 50. In this case, the power control apparatus 50 outputs the maximum current determined by the maximum current determination unit 56 to the separate control apparatus. Further, the input device 70 may be removed from the configuration shown in FIGS. 1 and 3, and the control amount determination unit 58 may determine the control amount to be given to the control target 80 on the basis of the maximum current determined by the maximum current determination unit 56, and other information.

The storage unit 60 is realized by a variety of storage devices such as a read only memory (ROM), a random access memory (RAM), a hard disk drive (HDD), a solid state drive (SSD), or other flash memory devices. In the storage unit 60, a program executed by the processor of the power control apparatus 50, voltage/current profile information 62 collected by the estimation unit 54, and the like are stored.

Hereinafter, details of processes in the estimation unit 54 and the maximum current determination unit 56 will be described. FIG. 4 is a diagram showing an example of the voltage/current profile information 62. The voltage/current profile information 62 is information grouped for each battery condition such as a temperature or an SOC. The estimation unit 54 groups combinations of voltages and electric currents for each battery cell 21 under each battery condition, on the basis of information input through the BMU 40, and registers the result in individual profile information 62A. The grouping process may be performed in the BMU 40. Further, since an electric current detected by the current sensor 30 is an electric current that flows in the battery unit 10, the BMU 40 or the power control apparatus 50 divides the electric current detected by the current sensor 30 by the number of parallels (2 in FIG. 2) of the battery cells 21 in the battery module 20 to calculate an electric current per battery cell 21, and registers the result in the individual profile information 62A.

The step sizes of the SOC and the temperature in the voltage/current profile information 62 may not be regular intervals, and may be arbitrarily determined. As shown in the figure, the step sizes of the SOC and the temperature in the voltage/current profile information 62 may be set to a pitch of 5% (a tolerance of 2.5%), for example, with respect to the SOC, and may be set to a pitch of 10%, for example, with respect to the temperature. In addition, with respect to a temperature range in which the influence of the temperature change on the characteristics of the battery cell 21 is small (for example, 10° C. to 25° C.), the step size may be set to be larger compared with other temperature ranges. Thus, it is possible to reduce a processing load in the power control apparatus 50. The estimation unit 54 performs a process of frequently adding information input from the BMU 40 to the individual profile information 62A and discarding old information, for example.

Figure 5:
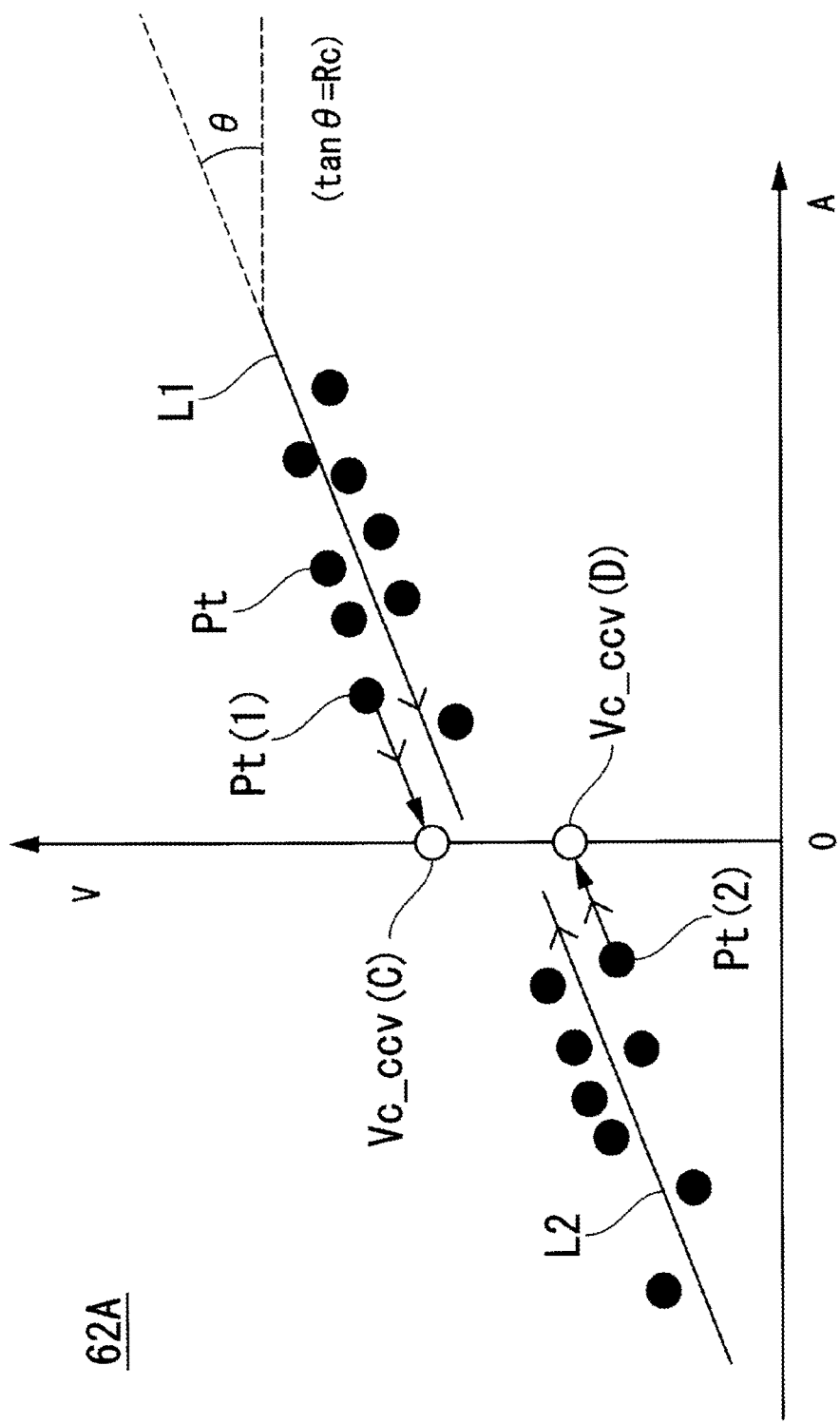
FIG. 5 is a diagram illustrating a process of estimating an internal resistance and a voltage at a zero current on the basis of individual profile information 62A.

FIG. 5 is a diagram illustrating a process of estimating an internal resistance and a voltage at a zero current on the basis of the individual profile information 62A. The individual profile information 62A is information indicating a collection of sets of voltages and electric currents shown in FIG. 5 (in the figure, each set is indicated by Pt). In the figure, a longitudinal axis represents a voltage (V) and a lateral axis represents an electric current (A). In the following description, a charging current is expressed as plus and a discharging current is expressed as minus. It is assumed that a "maximum current" (which will be described later) is calculated as an absolute value.

The estimation unit 54 applies a recursive method (statistical method) such as a least-square method to a combination of a voltage and an electric current under each battery condition to derive a voltage/current straight line L1 during charging and a voltage/current straight line L2 during discharging for each battery cell 21. Further, the estimation unit 54 derives an internal resistance Rc of the battery cell 21 on the basis of one or both of the voltage/current straight line L1 during charging and the voltage/current straight line L2 during discharging. For example, the estimation unit 54 derives a primary coefficient of the voltage/current straight line L1 during charging as the internal resistance Rc of the battery cell 21. The estimation unit 54 may separately derive the internal resistance Rc of the battery cell 21 during charging and the internal resistance Rc of the battery cell 21 during discharging, or may derive one internal resistance Rc by considering that the internal resistance Rc of the battery cell 21 during charging and the internal resistance Rc of the battery cell 21 during discharging are the same.

Further, the estimation unit 54 derives a (charging side) voltage Vc_ccv (C) of the battery cell 21 at the zero current or a (discharging side) voltage Vc_ccv (D) of the battery cell 21 at the zero current, on the basis of a set of a voltage Vc and an electric current Acell of the battery cell 21 input from the EMU 40 and the estimated internal resistance Rc as described above. The voltage at the zero current is a voltage in a case where it is assumed that an electric current that flows in the battery cell 21 becomes zero while maintaining the state of the battery cell 21 at that time point.

More specifically, during charging, the estimation unit 54 subtracts a product of the electric current Acell and the internal resistance Rc from the voltage Vc of the battery cell 21 input from the BMU 40, to thereby derive the (charging side) voltage Vc_ccv (C) of the battery cell 21 at the zero current. In FIG. 5, an example in which the voltage Vc_ccv (C) is calculated with respect to a set Pt(1) of the voltage Vc and the electric current Acell of one battery cell 21 is shown. As shown in the figure, in consideration of a virtual geometrical relationship, the voltage Vc_ccv (C) is a V-axis segment of a straight line that passes through the set of the voltage Vc and the electric current Acell of the battery cell 21 and has a gradient corresponding to the internal resistance Rc.

During discharging, the estimation unit 54 adds the product of the electric current Acell and the internal resistance Rc to the voltage Vc of the battery cell 21 input from the BMU 40, to thereby derive the (discharging side) voltage Vc_ccv (D) of the battery cell 21 at the zero current. In FIG. 5, an example in which the voltage Vc_ccv (D) is calculated with respect to a set Pt(2) of the voltage Vc and the electric current Acell of one battery cell 21 is shown. As shown in the figure, in consideration of a virtual geometrical relationship, the voltage Vc_ccv (D) is a V-axis segment of a straight line that passes through the set of the voltage Vc and the electric current Acell of the battery cell 21 and has a gradient corresponding to the internal resistance Rc.

Instead of the above-mentioned process, the estimation unit 54 may directly calculate the voltage Vc_ccv (C) from the voltage/current straight line L1 corresponding to a current battery condition. For example, the estimation unit 54 may set the V-axis segment of the voltage/current straight line L1 as the voltage Vc_ccv (C). Similarly, the estimation unit 54 may directly calculate the voltage Vc_ccv (D) from the voltage/current straight line L2 corresponding to a current battery condition. For example, the estimation unit 54 may set the V-axis segment of the voltage/current straight line L2 as the voltage Vc_ccv (D).

Figure 6:
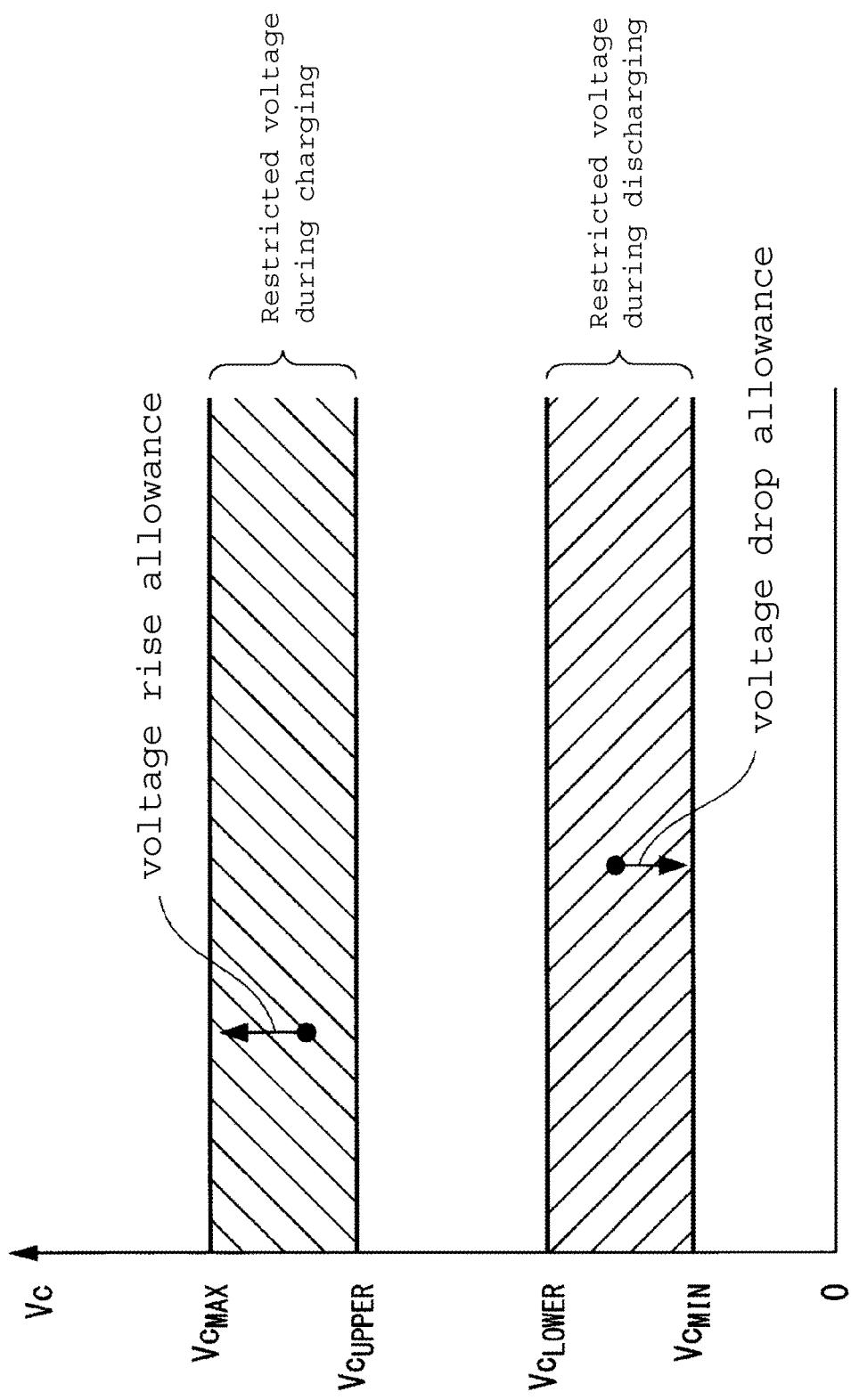
FIG. 6 is a diagram illustrating details of a process in a maximum current determination unit 56.

FIG. 6 is a diagram illustrating details of a process in the maximum current determination unit 56. The maximum current determination unit 56 determines a maximum current so that the voltage Vc of the battery cell 21 does not exceed an upper limit voltage $Vc_{MAX}$ (a first predetermined voltage) and does not fall under a lower limit voltage $Vc_{MIN}$ (a second predetermined voltage). The upper limit voltage $Vc_{MAX}$ and the lower limit voltage $Vc_{MIN}$ are values which are determined in advance from a viewpoint of suppressing deterioration of the battery cell 21.

In a case where the voltage Vc of the battery cell 21 is larger than a first threshold value voltage $Vc_{UPPER}$ and the voltage Vc of the battery cell 21 is rising (that is, during charging), the maximum current determination unit 56 determines the maximum current of the battery cell 21 so that the voltage Vc of the battery cell 21 is within a range of a voltage rise allowance shown in FIG. 6.

Further, in a case where the voltage Vc of the battery cell 21 is smaller than a second threshold value voltage $Vc_{LOWER}$ and the voltage Vc of the battery cell 21 is decreased (that is, during discharging), the maximum current determination unit 56 determines the maximum current of the battery cell 21 so that the voltage Vc of the battery cell 21 is within a range of a voltage drop allowance shown in FIG. 6.

In other cases, the maximum current determination unit 56 does not determine the maximum current of the battery cell 21. That is, the power control apparatus 50 performs a charging/discharging control based on completely different factors without a specific limit with respect to the maximum current.

The maximum current determination unit 56 determines the maximum current based on the following expressions. First, parameters in the expressions will be described.

np_cell is a module parallel number, that is, the number of parallel battery cells 21 in the battery module 20. In the example of FIG. 2, np_cell is 2.

np_mod is a system parallel number, that is, the number of parallel battery modules 20. In the example of FIG. 1, np_mod is n.

Acellmax is a maximum current allowed per battery cell 21.

Amodmax is a maximum current allowed per battery module 20.

Amax is a sum (system maximum current) of maximum currents at which charging and discharging of each battery unit 10 are allowed in the power control system 1, and is a maximum current supplied to the control target 80 through the power line PL.

(1) During Charging

In a case where the voltage Vc of the battery cell 21 is larger than the first threshold value voltage $Vc_{UPPER}$, during charging of the battery cell 21, the maximum current determination unit 56 derives the system maximum current Amax on the basis of Expressions (1) to (3).

$$A\text{cellmax}=(VC_{MAX}-Vc\_ccv(C))/Rc \quad (1)$$

$$A\text{modmax}=np\_A\text{cellmax} \quad (2)$$

$$A\text{max}=np\_\text{mod}*A\text{modmax} \quad (3)$$

As understood from Expression (1), the maximum current determination unit 56 divides a value obtained by subtracting the voltage Vc_ccv (C) from the upper limit voltage $Vc_{MAX}$ of the battery cell 21 by the internal resistance Rc, to thereby calculate the maximum current of the battery cell 21. That is, the maximum current determination unit 56 compares a voltage obtained by correcting a voltage change due to the internal resistance with a threshold value, to thereby calculate the maximum current of the battery cell 21. Thus, the battery control apparatus 50 can more accurately limit the voltage of the secondary battery.

Here, instead of employing the above-described method, a case where the voltage Vc of the battery cell 21 which is actually measured is compared with the upper limit voltage $Vc_{MAX}$ of the battery cell 21 to calculate the maximum current will be described. In this case, since the voltage Vc of the battery cell 21 which is actually measured is a voltage in which an electric current that flows in the battery cell 21 and the voltage change due to the internal resistance overlap each other, first, a process of calculating a "maximum current capable of being added to a present electric current" and adding the calculated value to the present electric current is performed. However, since the measured electric current is changed over time, if the process of adding the electric current to the electric current is performed, an error may become large.

In this regard, since the power control apparatus 50 of this embodiment calculates the voltage Vc_ccv (C) at the zero current and calculates the maximum current on the basis of the calculated voltage Vc_ccv (C), it is possible to more accurately derive the maximum current, and to more accurately limit the voltage of the secondary battery.

(During Discharging)

During discharging of the battery cell 21, in a case where the voltage Vc of the battery cell 21 is smaller than the second threshold value voltage $Vc_{LOWER}$, the maximum current determination unit 56 derives the system maximum current Amax on the basis of Expressions (4) to (6).

$$A\text{cellmax}=(Vc\_ccv(D)-Vc_{min})/Rc \quad (4)$$

$$A\text{modmax}=np\_\text{cell} \times A\text{cell max} \quad (5)$$

$$A\text{max}=np\_\text{mod}*A\text{modmax} \quad (6)$$

As understood from Expression (4), the maximum current determination unit 56 divides a value obtained by subtracting the lower limit voltage $Vc_{MIN}$ of the battery cell 21 from the voltage Vc_ccv (D) by the internal resistance Rc, to thereby calculate the maximum current of the battery cell 21. Thus, the battery control apparatus 50 can more accurately limit the voltage of the secondary battery.

Hereinafter, a flow of a process executed in the power control apparatus 50 will be described.

Figure 7:
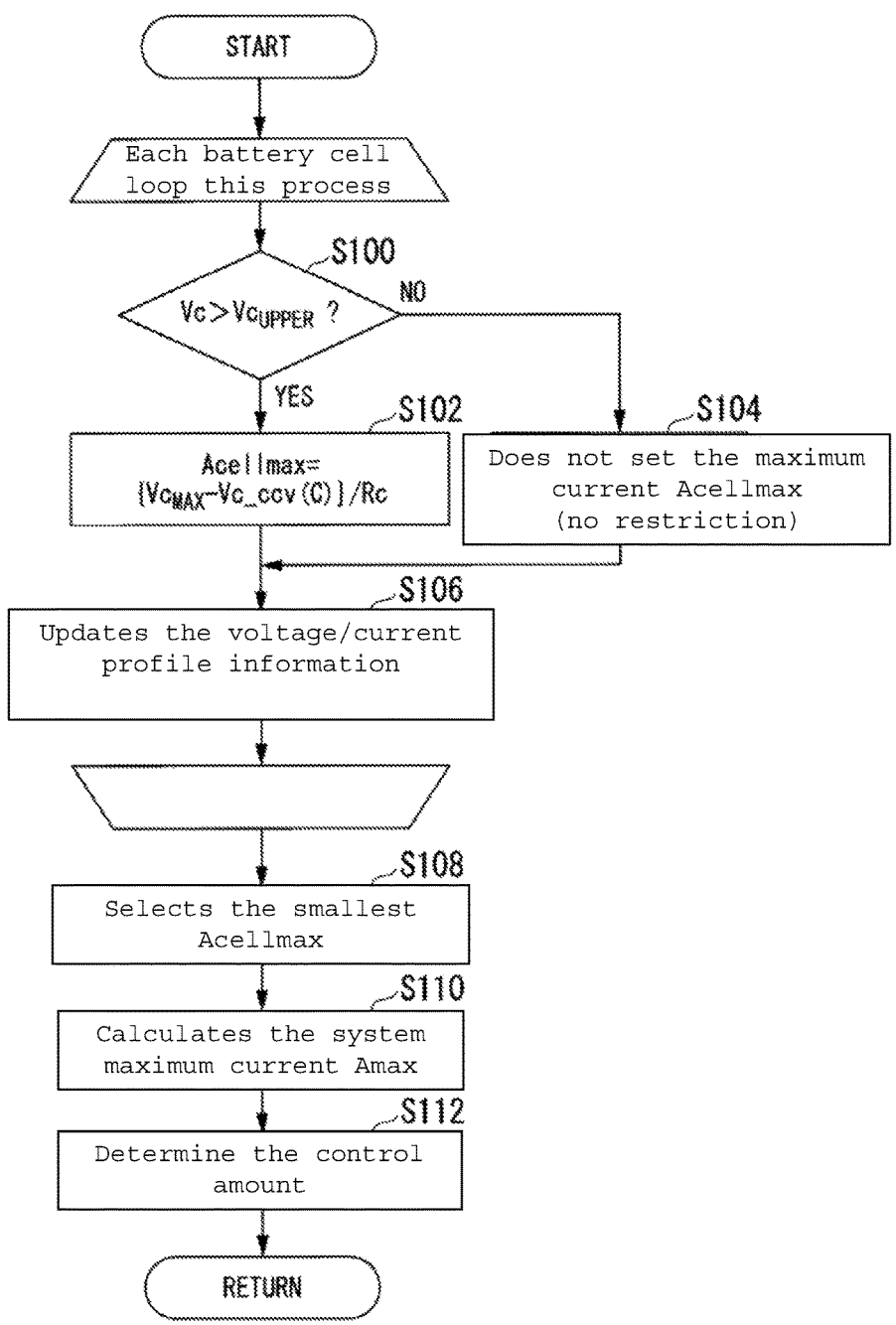
FIG. 7 is a flowchart showing an exemplary flow of a process executed during charging in a power control apparatus 50.

FIG. 7 is a flowchart showing an exemplary flow of a process executed during charging in the power control apparatus 50. It is assumed that the process in the estimation unit 54 is executed as a separate routine from this flowchart.

The maximum current determination unit 56 of the power control apparatus 50 executes processes of steps S100 to S106 for each battery cell 21. First, the maximum current determination unit 56 determines whether the voltage Vc of the battery cell 21 is larger than the first threshold value voltage $Vc_{UPPER}$ (step S100).

In a case where the voltage Vc of the battery cell 21 is larger than the first threshold value voltage $Vc_{UPPER}$, the maximum current determination unit 56 divides a value obtained by subtracting the voltage Vc_ccv (C) from the upper limit voltage $Vc_{MAX}$ of the battery cell 21 by the internal resistance Rc, to thereby calculate the maximum current Acellmax allowed per battery cell 21 (step S102). On the other hand, if the voltage Vc of the battery cell 21 is equal to or smaller than the first threshold value voltage $Vc_{UPPER}$, the maximum current determination unit 56 does not set the maximum current Acellmax allowed per battery cell 21 (step S104). That is, the maximum current determination unit 56 does not limit the electric current per battery cell 21.

Then, the maximum current determination unit 56 (or the estimation unit 54) updates items corresponding to a temperature and an SOC at that time, in the voltage/current profile information 62 (step S106).

If the processes of steps S100 to S106 are executed for each battery cell 21, the maximum current determination unit selects the smallest one among the calculated maximum currents Acellmax allowed per battery cell 21 (step S108), and calculates the system maximum current Amax on the basis of the selected maximum current Acellmax (step S110; see Expressions (2) and (3)).

Further, the control amount determination unit 58 sets a control amount to be given to the control target 80 using the system maximum current Amax as an upper limit value, on the basis of operation information input from the input device 70 (S112). For example, first, the control amount determination unit 58 determines a primary duty ratio of a switching control to be given to the control target 80 on the basis of the operation information input from the input device 70. If the primary duty ratio does not exceed a duty ratio corresponding to the system maximum current Amax, the control amount determination unit 58 gives the primary duty ratio to the control target 80 as a control amount. If the primary duty ratio exceeds the duty ratio corresponding to the system maximum current Amax, the control amount determination unit 58 gives the duty ratio corresponding to the system maximum current Amax to the control target 80 as the control amount. Hence, the processes of this flowchart are terminated.

Figure 8:
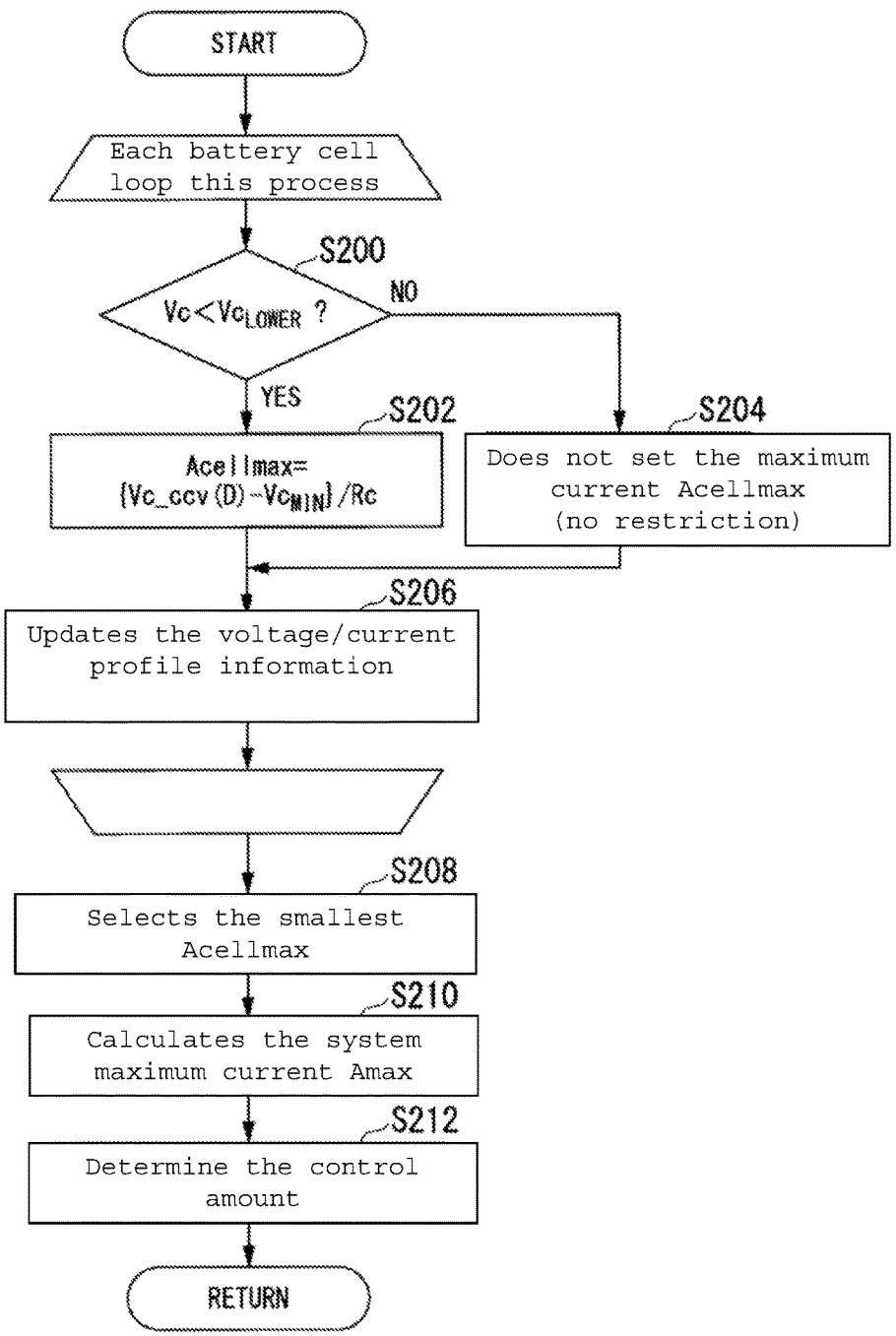
FIG. 8 is a flowchart showing an exemplary flow of a process executed during discharging in the power control apparatus 50.

FIG. 8 is a flowchart showing an exemplary flow of a process executed during discharging in the power control apparatus 50. It is assumed that the process in the estimation unit 54 is executed as a separate routine from this flowchart.

The maximum current determination unit 56 of the power control apparatus 50 executes processes of steps S200 to S206 for each battery cell 21. First, the maximum current determination unit 56 determines whether the voltage Vc of the battery cell 21 is smaller than the second threshold value voltage $Vc_{LOWER}$ (step S200).

If the voltage Vc of the battery cell 21 is smaller than the second threshold value voltage $Vc_{LOWER}$, the maximum current determination unit 56 divides a value obtained by subtracting the lower limit voltage $Vc_{MIN}$ of the battery cell 21 from the voltage Vc_ccv (D) by the internal resistance Rc, to thereby calculate the maximum current Acellmax allowed per battery cell 21 (step S202). On the other hand, if the voltage Vc of the battery cell 21 is equal to or larger than the second threshold value voltage $Vc_{LOWER}$, the maximum current determination unit 56 does not set the maximum current Acellmax allowed per battery cell 21 (step S204). That is, the maximum current determination unit 56 does not limit the electric current per battery cell 21.

Then, the maximum current determination unit 56 (or the estimation unit 54) updates items corresponding to a temperature and an SOC at that time, in the voltage/current profile information 62 (step S206).

If the processes of steps S200 to S206 are executed for each battery cell 21, the maximum current determination unit selects the smallest one among the calculated maximum currents Acellmax allowed per battery cell 21 (step S208), and calculates the system maximum current Amax on the basis of the selected maximum current Acellmax (step S210; see Expressions (5) and (6)).

Further, the control amount determination unit 58 sets a control amount to be given to the control target 80 using the system maximum current Amax as an upper limit value, on the basis of operation information input from the input device 70 (S212). For example, first, the control amount determination unit 58 determines a primary command value of electric power generation to be given to the control target 80 on the basis of operation information input through the input device 70. If the primary command value does not exceed electric power generation corresponding to the system maximum current Amax, the control amount determination unit 58 gives the primary command value to the control target 80 as the control amount, and if the primary command value exceeds the electric power generation corresponding to the system maximum current Amax, the control amount determination unit 58 gives the electric power generation corresponding to the system maximum current Amax to the control target 80 as the control amount. Hence, the processes of this flowchart are terminated.

According to the power control apparatus 50 of the embodiment described above, since information relating to a voltage and an electric current of the chargeable/dischargeable battery cell 21 during charging is acquired and the maximum current Acellmax of the battery cell 21 during charging is determined so that the voltage of the battery cell 21 does not exceed the upper limit voltage $Vc_{MAX}$ on the basis of the acquired information, it is possible to accurately limit the voltage of the battery cell 21 in a system where a relatively large electric current flows.

Further, according to the power control apparatus 50 of the embodiment described above, since information relating to a voltage and an electric current of the chargeable/dischargeable battery cell 21 during discharging is acquired and the maximum current Acellmax of the battery cell 21 during discharging is determined so that the voltage of the battery cell 21 does not fall under the lower limit voltage $Vc_{MIN}$ on the basis of the acquired information, it is possible to accurately limit the voltage of the battery cell 21 in a system where a relatively large electric current flows.

In addition, according to the power control apparatus 50 of the embodiment, since the system maximum current Amax is calculated based on the smallest one among the maximum currents Acellmax calculated for each battery cell 21, it is possible to perform a control on a safety side according to a progressing state of deterioration that shows an individual difference for each battery cell 21.

Furthermore, according to the power control apparatus 50 of the embodiment, as the internal resistance Rc of the battery cell 21 is derived by a statistical method and a voltage at a zero current is calculated on the basis of the derived internal resistance Rc, it is possible to more accurately limit the voltage of the battery cell 21.

In the embodiments, the power control apparatus 50 has a configuration for determining the maximum current Acellmax of the battery cell 21 so that the voltage of the battery cell 21 during charging does not exceed the upper limit voltage $Vc_{MAX}$ and also has a configuration for determining the maximum current Acellmax of the battery cell 21 so that the voltage of the battery cell 21 during discharging does not fall under the lower limit voltage $Vc_{MIN}$, but may have only one configuration among the two configurations.

Further, the connection configuration of the batteries shown in FIGS. 1 and 2 is merely an example, and for example, the power control system 1 may be provided with only one battery unit 10. In addition, the power control apparatus 50 may be integrated with the BMU 40.

Application Example

Figure 9:
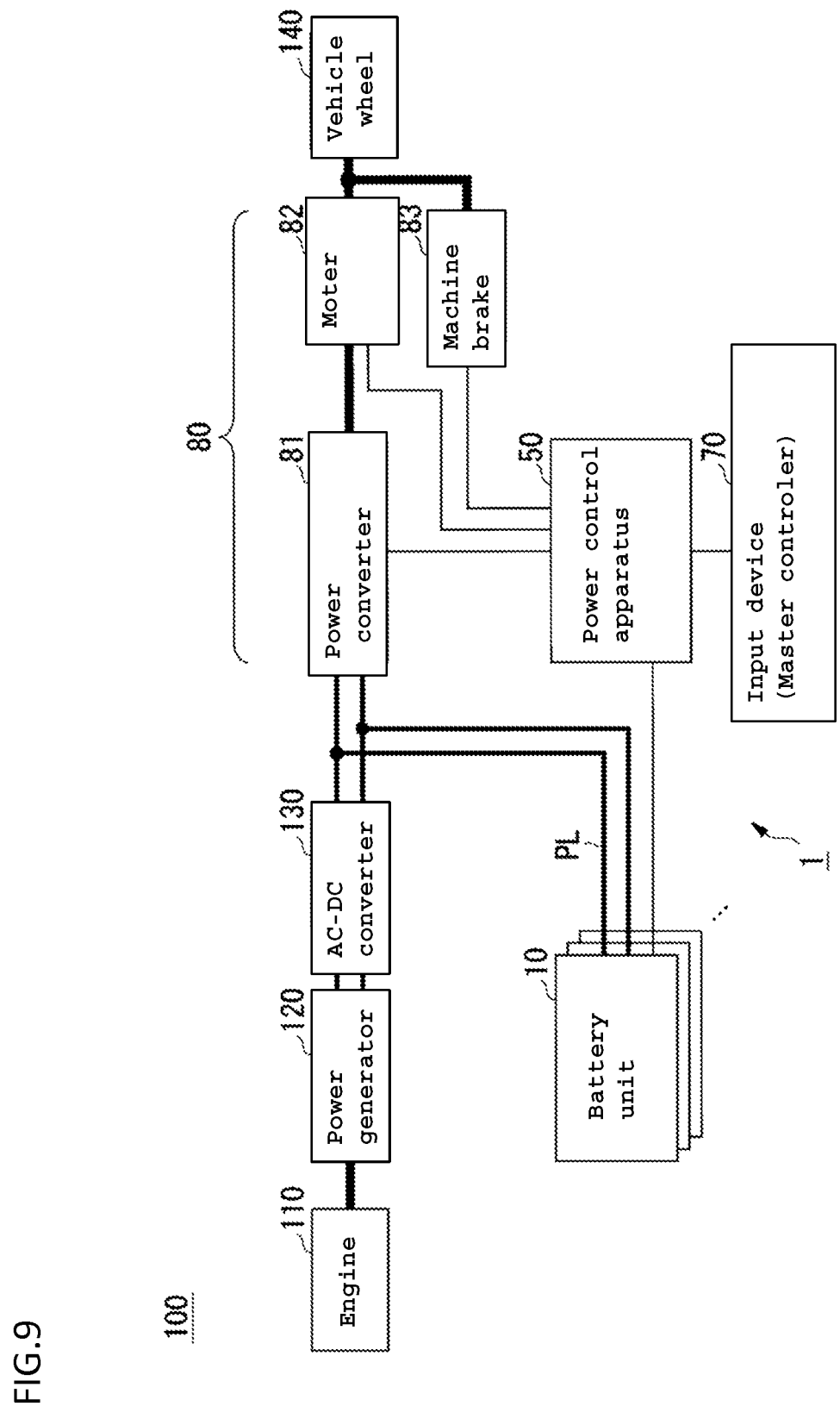
FIG. 9 is a diagram showing an exemplary configuration of a mobile system 100 using the power control system 1.
Figure 10:
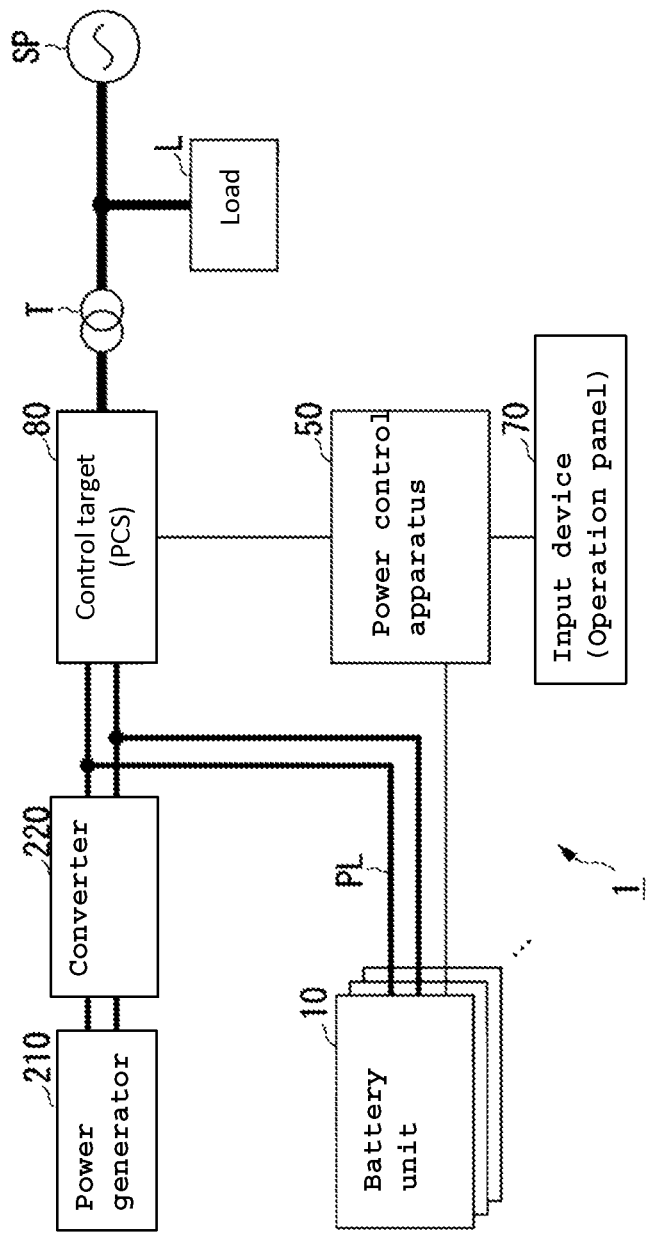
FIG. 10 is a diagram showing an exemplary configuration of a stationary type battery system 200 using the power control system 1.

Hereinafter, an application example of the power control system 1 will be described. FIG. 9 is a diagram showing an exemplary configuration of a mobile system 100 using the power control system 1. The mobile system 100 is a system that drives a hybrid railroad vehicle (hereinafter, referred to as a vehicle), for example. The mobile system 100 includes the power control system 1, and further includes an engine 110, a power generator 120, an AC-DC converter 130, and a vehicle wheel 140. In FIG. 9 and FIG. 10 (which will be described later), a battery unit 10 is shown on behalf of a plurality of battery units.

The engine 110 outputs power by burning fuel such as gasoline. The power generator 120 generates electricity using the power output from the engine 110. The AC-DC converter 130 converts a two-phase or three-phase alternating current output from the power generator 120 into a direct current, and outputs the result.

A power line PL that extends from the battery unit 10 is combined with a power line on an output side of the AC-DC converter 130 through a direct current link circuit, and then, is connected to a power converter 81. In the example of FIG.

9, as the control target 80 of the power control apparatus 50, the power converter 81, a motor 82, a machine brake 83 are shown.

The power converter 81 converts an input direct current into an alternating current and outputs the result to the motor 82, or converts electric power regenerated by the motor 82 into a direct current and provides the result to the battery unit 10. The motor 82 rotates the vehicle wheel 140 to drive the vehicle, or generates electricity through regeneration during deceleration of the vehicle. The machine brake 83 is a device for decelerating the vehicle using a mechanical action.

Further, the mobile system 100 includes a master controller that is capable of inputting a notch instruction or a brake instruction as the input device 70.

During discharging of the battery unit 10, the power control apparatus 50 calculates power to be output to the vehicle wheel 140 on the basis of a notch instruction which is operation information input from the master controller 70, and subtracts power that can be output by the engine 110 from the calculated power to calculate power discharged by the battery unit 10. In addition, the power control apparatus 50 calculates an electric current that flows from the battery unit 10 on the basis of the power discharged by the battery unit 10, and determines whether the calculated electric current exceeds the above-described system maximum current Amax. If the calculated electric current exceeds the system maximum current Amax, the power control apparatus 50 limits a duty ratio to be given to the power converter 81, or outputs an instruction for increasing the power output by the engine 110 to an engine controller (not shown).

During charging of the battery unit 10, the power control apparatus 50 calculates a regenerative power that acts on the vehicle wheel 140 on the basis of the brake instruction which is the operation information input from the master controller 70, and calculates power that can be charged to the battery unit 10 on the basis of the regenerative power. Further, the power control apparatus 50 calculates an electric current that flows into the battery unit 10 on the basis of the power that can be charged to the battery unit 10, and determines whether the calculated electric current exceeds the above-described system maximum current Amax. If the calculated electric current exceeds the system maximum current Amax, the power control apparatus 50 performs a control for operating the machine brake 83 to limit the power generated by the motor 82, for example.

As an application example of the power control system 1, the hybrid railroad vehicle is shown, but the application example is not limiting. The power control system 1 may be also applied to a stationary type battery system connected to a power generator such as a solar panel (PV) or a fuel cell (FC) and a system power. FIG. 10 is a diagram showing an exemplary configuration of a stationary type battery system 200 using the power control system 1.

A power generator 210 is a solar panel (PV), a fuel cell (FC), or the like. In a case where the power generator 210 generates an alternating current, a converter 220 is an AC-DC converter, and in a case where the power generator 210 generates direct current, the converter 220 is a DC-DC converter. The control target 80 is a power conditioning system (PCS), for example. The PCS is connected to a system power SP and a load L through a transformer T. Thus, power generated by the power generator 210 is supplied to the side of the system power SP while being accumulated in the battery unit 10.

In this case, the power control apparatus 50 controls the control target 80 so that an electric current that flows out of the battery unit 10 does not exceed the system maximum current Amax. For example, the power control apparatus 50 performs a control so that a duty ratio given to the PCS does not exceed a duty ratio corresponding to the system maximum current Amax. In addition, the power generator 210 and the converter 220 may be included as control targets in this case, and the power control apparatus 50 may control the power generator 210 and the converter 220 so that an electric current that flows into the battery unit 10 does not exceed the system maximum current Amax.

According to at least one embodiment described above, since information relating to a voltage and an electric current of the chargeable/dischargeable battery cell 21 during charging is acquired and the maximum current Acellmax of the battery cell 21 during charging is determined so that the voltage of the battery cell 21 does not exceed the upper limit voltage $Vc_{MAX}$ on the basis of the acquired information, it is possible to accurately limit the voltage of the battery cell 21.

According to at least one embodiment described above, since information relating to a voltage and an electric current of the chargeable/dischargeable battery cell 21 during discharging is acquired and the maximum current Acellmax of the battery cell 21 during discharging is determined so that the voltage of the battery cell 21 does not fall under the lower limit voltage $Vc_{MIN}$ on the basis of the acquired information, it is possible to accurately limit the voltage of the battery cell 21.

While certain embodiments have been described, these embodiments have been presented by way of example only, and are not intended to limit the scope of the inventions. The embodiments described herein may be embodied in a variety of other forms; furthermore, various omissions, substitutions and changes in the form of the methods and systems described herein may be made without departing from the spirit of the inventions. The embodiments and their equivalents are intended to cover such forms or modifications as would fall within the scope and spirit of the inventions.

What is claimed is:
1. A power control apparatus comprising:
acquisition circuitry configured to acquire information relating to a voltage and an electric current of a secondary battery during charging;
estimation circuitry configured to estimate a voltage of the secondary battery at a zero current based on the information acquired by the acquisition circuitry; and
current determining circuitry configured to determine a maximum current of the secondary battery during charging using the voltage of the secondary battery at the zero current estimated by the estimation circuitry and a first predetermined voltage, wherein
the acquisition circuitry is configured to acquire information relating to voltages and electric currents of a plurality of secondary batteries during charging; and
the current determining circuitry is configured to:
determine a maximum current of each secondary battery during charging so that the voltage of the secondary battery does not exceed the first predetermined voltage based on the information acquired by the acquisition circuitry, and
determine a maximum current that flows into the plurality of secondary batteries during charging of the plurality of secondary batteries based on the smallest value among the determined maximum currents.
2. A power control system comprising:
the power control apparatus according claim 1; and
one or more secondary batteries including the secondary battery.

3. A power control apparatus comprising:
acquisition circuitry configured to acquire information relating to a voltage and an electric current of a secondary battery during charging;
estimation circuitry configured to estimate a voltage of the secondary battery at a zero current for each of a plurality of conditions based on the information acquired by the acquisition circuitry; and
current determining circuitry configured to determine a maximum current of the secondary battery during charging using the voltage at the zero current under one condition among the plurality of conditions and a first predetermined voltage, wherein
the acquisition circuitry is configured to acquire information relating to voltages and electric currents of a plurality of secondary batteries during charging; and
the current determining circuitry is configured to:
determine a maximum current of each secondary battery during charging so that the voltage of the secondary battery does not exceed the first predetermined voltage based on the information acquired by the acquisition circuitry, and
determine a maximum current that flows into the plurality of secondary batteries during charging of the plurality of secondary batteries based on the smallest value among the determined maximum currents.

4. The power control apparatus according to claim 3, wherein the estimation circuitry is configured to:
estimate an internal resistance of the secondary battery with respect to at least one condition among the plurality of conditions based on the information acquired by the acquisition circuitry, and
estimate the voltage of the secondary battery at the zero current using the estimated internal resistance.

5. The power control apparatus according to claim 4, wherein the current determining is circuitry configured to determine the maximum current of the secondary battery during charging by dividing a difference between the first predetermined voltage and the voltage of the secondary battery at the zero current estimated by the estimating circuitry by the internal resistance of the secondary battery estimated by the estimation circuitry.

6. The power control apparatus according to claim 3, wherein the estimation circuitry is configured to:
estimate an internal resistance of the secondary battery for each condition based on a predetermined temperature condition and a predetermined state of charge condition, and
estimate the voltage of the secondary battery at the zero current using the estimated internal resistance of the secondary battery.

7. A power control system comprising:
the power control apparatus according claim 3; and
one or more secondary batteries including the secondary battery.

8. A power control apparatus comprising:
acquisition circuitry configured to acquire information relating to a voltage and an electric current of a secondary battery during discharging;
estimation circuitry configured to estimate a voltage of the secondary battery at a zero current based on the information acquired by the acquisition circuitry; and
current determining circuitry configured to determine a maximum current of the secondary battery during discharging using the voltage of the secondary battery at the zero current estimated by the estimation circuitry and a second predetermined voltage, wherein
the acquisition circuitry is configured to acquire information relating to voltages and electric currents of a plurality of secondary batteries during discharging; and
the current determining circuitry is configured to:
determine a maximum current of each secondary battery during discharging so that the voltage of the secondary battery does not fall under the second predetermined voltage based on the information acquired by the acquisition circuitry, and
determine a maximum current that flows out of the plurality of secondary batteries during discharging of the plurality of secondary batteries based on the smallest value among the determined maximum currents.

9. A power control system comprising:
the power control apparatus according claim 8; and
one or more secondary batteries including the secondary battery.

10. A power control apparatus comprising:
acquisition circuitry configured to acquire information relating to a voltage and an electric current of a secondary battery during discharging;
estimation circuitry configured to estimate a voltage of the secondary battery at a zero current for each of a plurality of conditions, based on the information acquired by the acquisition circuitry; and
current determining circuitry configured to determine a maximum current of the secondary battery during discharging using the voltage at the zero current under one condition among the plurality of conditions and a second predetermined voltage, wherein
the acquisition circuitry is configured to acquire information relating to voltages and electric currents of a plurality of secondary batteries during discharging; and
the current determining circuitry is configured to:
determine a maximum current of each secondary battery during discharging so that the voltage of the secondary battery does not fall under the second predetermined voltage based on the information acquired by the acquisition circuitry, and
determine a maximum current that flows out of the plurality of secondary batteries during discharging of the plurality of secondary batteries based on the smallest value among the determined maximum currents.

11. The power control apparatus according to claim 10, wherein the estimation circuitry is configured to:
estimate an internal resistance of the secondary battery with respect to at least one condition among the plurality of conditions based on the information acquired by the acquisition unit, and
estimate the voltage of the secondary battery at the zero current using the estimated internal resistance.

12. The power control apparatus according to claim 11, wherein the current determining circuitry is configured to determine the maximum current of the secondary battery during discharging by dividing a difference between the second predetermined voltage and the voltage of the secondary battery at the zero current estimated by the estimation circuitry by the internal resistance of the secondary battery estimated by the estimation circuitry.

13. The power control apparatus according to claim 10, wherein the estimation circuitry is configured to:
estimate an internal resistance of the secondary battery for each condition based on a predetermined temperature condition and a predetermined state of charge condition, and estimate the voltage of the secondary battery at the zero current using the estimated internal resistance of the secondary battery.

14. A power control system comprising:

the power control apparatus according claim 10; and one or more secondary batteries including the secondary battery.

* * * * *